United States Patent [19]

Ladany et al.

[11] 3,802,967

[45] Apr. 9, 1974

[54] III-V COMPOUND ON INSULATING SUBSTRATE AND ITS PREPARATION AND USE

[75] Inventors: Ivan Ladany, Skillman; Chih Chun Wang, Hightstown, both of N.J.

[73] Assignee: RCA Corporation, New York, N.Y.

[22] Filed: Aug. 27, 1971

[21] Appl. No.: 175,547

[52] U.S. Cl. ................. 148/171, 148/172, 148/175, 148/33.4, 148/33.5, 252/62.3 GA, 317/235 R, 117/106 A, 117/201

[51] Int. Cl. ............................ H01l 7/36, H01l 7/38

[58] Field of Search .......... 148/171, 172, 175, 174, 148/33.5, 33.1, 33, 33.4; 252/62.3 GA; 317/235 NA, 235 N; 117/201, 106 A

[56] References Cited

UNITED STATES PATENTS

| | | | |
|---|---|---|---|
| 3,226,270 | 12/1965 | Miederer et al. | 148/174 |
| 3,364,084 | 1/1968 | Ruehrwein | 148/175 |
| 3,669,767 | 6/1972 | Hackett et al. | 148/171 |
| 3,647,579 | 3/1972 | Ladany | 148/171 |

OTHER PUBLICATIONS

Trumbore et al., Journal of Applied Physics, Vol. 38, No. 4, pp. 1987 and 1988, (March 1967), QC 1.J 82.

Manasevit et al., J. Electrochem. Soc., Vol. 116, No. 12, pp. 1725–1732 (Dec. 1969).

Shih et al., Journal of Applied Physics, Vol. 39, No. 6, pp. 2747–2749 (May 1968), QC 1.J 82.

*Primary Examiner*—G. T. Ozaki

*Attorney, Agent, or Firm*—Glenn H. Bruestle; Donald S. Cohen

[57] ABSTRACT

A III-V semiconductor compound is grown on an insulating substrate by a novel two-stage process and the resultant insulator-semiconductor composite is useful for a variety of improved III-V devices. A gallium arsenide-on-insulator structure when made in this way exhibits improved frequency response and higher temperature capability than that obtained in devices fabricated on bulk gallium arsenide and existing silicon-insulator composites. A device and a semiconductor device array structure using the improved composite is shown. The device array structure has devices arrayed on one surface of the substrate with light emitted through the other surface.

A method is given for producing these III-V insulating substrate composites by providing monocrystalline films of a III-V compound deposited by vapor phase epitaxy from organometallics and then partially dissolving this film so that the growth of the layer may continue by liquid phase epitaxy.

20 Claims, 7 Drawing Figures

INVENTOR.
CHIH CHUN WANG &
IVAN LADANY
BY Glenn H. Bruestle
ATTORNEY

INVENTOR.
CHIH CHUN WANG &
IVAN LADANY
BY Glenn H. Bruestle
ATTORNEY

III-V COMPOUND ON INSULATING SUBSTRATE AND ITS PREPARATION AND USE

BACKGROUND OF THE INVENTION

1. Field of the Invention

The invention herein described was made in the course of or under a contract or subcontract thereunder with the Department of the Air Force.

The invention relates to the growth of a composite consisting of a layer of a III-V semiconductor material on an insulating substrate, and to devices made using such composites.

2. Description of the Prior Art

While various III-V semiconductors are grown directly on III-V or other semiconductor substrates, heteroepitaxy of III-V compounds directly on single crystal insulating substrates has met with little success. One approach to the problem has been to place a nucleation layer of either silicon or germanium upon the substrate wafer and then, by means of vapor phase epitaxy, grow on the nucleation layer a layer of a III-V compound from such reactants as gallium trichloride and arsine. Another technique involves the vapor deposition of a III-V compound directly onto an insulating substrate from an organometallic source, such as trimethyl gallium. A disadvantage of this technique is that devices made thereby have exhibited excessive graininess as indicated by mosaic structures.

Another development was that of homoepitaxy of GaAs on monocrystalline GaAs substrates. Homoepitaxy by the liquid phase epitaxial (LPE) growth technique was first described by Nelson in 1963 (see H. Nelson, "Epitaxial Growth from the Liquid State and Its Application to the Fabrication of Tunnel and Laser Diodes" RCA Review, December 1963, p. 603 et seq.) The principle of this technique involves the dissolving of GaAs in molten Ga and the growth of GaAs on a seed crystal in contact with the melt upon subsequent cooling. A detailed description of the technique appears in U.S. Pat. No. 3,158,512, issued Nov. 24, 1964 to H. Nelson et al.

Refinements and modifications of the LPE technique have led to the development of GaAs devices including light emitting diodes, injection lasers and Gunn oscillators. These and other devices are described in a book edited by E. I. Pederson in 1968 (Proceedings of the Second International Symposium on Gallium Arsenide, Chapter 1, "Liquid Phase Epitaxial Growth," published by the Institute of Physics and the Physical Society, London, England). The LPE growth technique has been also successfully applied to the growth of homoepitaxial GaP layers as first described by Lorenz and Pilkuhn in 1966 [M. R. Lorenz and M. Pilkuhn, "Preparation and Properties of Solution Grown Epitaxial *p–n* Junctions in GaP," Journal of Applied Physics, Vol. 37, pp. 4094–4102 (1969)]. The LPE process has heretofore been severely limited because it has not been economically feasible to produce large monocrystalline gallium arsenide or gallium phosphide substrate wafers.

In III-V semiconductors formed on insulating substrates by the technique of chemical vapor deposition from an organometallic or the use of a nucleation layer of silicon or germanium, it has not been possible heretofore to achieve PN junctions of sufficiently high quality.

DESCRIPTION OF THE PREFERRED EMBODIMENTS

Figure 1:
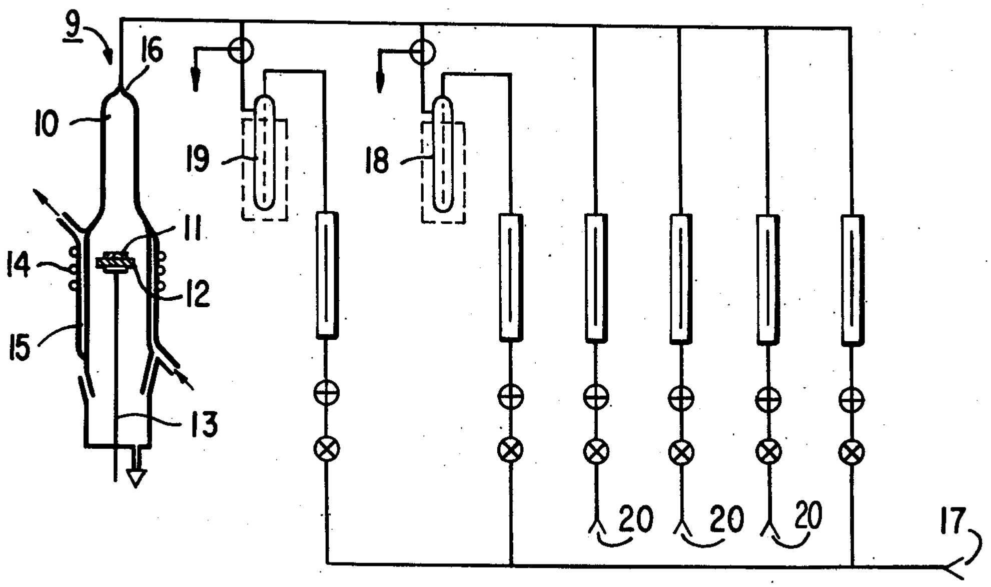
FIG. 1 is a schematic diagram of an apparatus for the deposition of III-V compounds by vapor phase epitaxy.

In the present novel process, an improved monocrystalline III-V compound is grown on an insulating substrate in two stages. In general, the deposition of the III-V compound is practiced herein by forming a first portion by known chemical vapor deposition technique from the vapor product of an organometallic compound, usually containing the group III element, and then in a subsequent step, partially dissolving this portion and continuing its growth by liquid phase epitaxy of a second portion of the same binary III-V compound or of a ternary III-V compound containing the elements of the first portion. Several combinations of first and second portions may be achieved. These are, for example: a first portion of gallium arsenide (GaAs) and a second portion of GaAs; a first portion of GaAs and a second portion of gallium arsenide phosphide ($GaAs_xP_{1-x}$); a first portion of GaAs and a second portion of gallium aluminum arsenide ($Ga_xAl_{1-x}As$); a first portion of gallium phosphide (GaP) and a second portion of GaP; and, a first portion of GaP and a second portion of $GaAs_xP_{1-x}$ in all of which $x$ is a value less than unity.

Substrate surface perfection has a direct effect on the heteroepitaxy of III-V compounds. In the present invention the quality of the mechanically polished wafer is of critical importance for high quality III-V growth. After the completion of the mechanical polishing, scratches, mounds, adsorbed layers, and impurity aggregates are generally present on the substrate surface. These imperfections may be eliminated to some degree by chemical polishing techniques which are well known in the art. To reduce surface contamination of an insulating substrate, ultrasonic cleaning is often used following by degreasing with trichlorethylene and by rinsing with acetone, alcohol, and deionized water.

While in the practice of the invention almost any monocrystalline insulating substrate may be used, the invention has been found particularly applicable to metallic oxide ceramic substrates such as beryllia, magnesium aluminate spinel, magnesium hydroxyl aluminate spinel, sapphire, and thoria. Of special interest has been those single crystal GaAs films with thickness up to 70 μ which have been grown on magnesium aluminate spinel substrates (referred to hereinafter as spinel substrates.) The aforementioned substrates are considered transparent in that they permit passage of light of wavelength in the range of 0.15 μm to 10 μm.

Also, substrate orientation plays a critical role in the ease with which the epitaxial layers grow. The ease of growth of GaAs on spinel decreases with crystal orientation in the order: (111), (110), and (100). Single crystal (111) GaAs films can be more consistently grown on the (111) spinel orientation than on any other orientation. The epitaxy of (100) GaAs on (110) spinel is more sensitive to substrate surface preparation than that of (111) GaAs on (111) spinel. The (100) GaAs films have been successfully grown on (110) spinel substrates which had a high quality surface. Films grown on (100) spinel substrates have been polycrystalline with isolated (100) GaAs single crystal areas. The epitaxial relationship between GaAs and spinel and the crystalline perfection of the films are described below. The characteristic oriented single crystal growth patterns on the surfaces of (111) GaAs films (~20μm thick) grown on (111) spinel substrates prepared by the flame fusion, Czochralski, and flux methods are readily shown in scanning electron micrographs. Surface structures of (100) GaAs (~20μm thick) grown on flame fusion (110) and (100) spinel substrates are readily shown in photomicrographs. When sapphire is used as the substrate, the (0001) surface is the preferred orientation.

Because of the lack of a center of symmetry, there exist the (111)A and (111)B faces for GaAs. The physical and chemical characteristics of the two faces are distinctly different. Simultaneous growth of GaAs on (111) spinel and on the (111)A and (111)B faces of GaAs reveals that the surface of GaAs grown on (111) spinel resembles that growth on the (111)A face of GaAs. That the face of GaAs grown on spinel is a (111)A face has been further confirmed by the fact that the etching behavior of GaAs grown on spinel is similar to that of the (111)A face of a bulk GaAs sample.

In the preferred forms of the method, the first stage of the two-stage process, that of chemical vapor deposition, may be achieved by the use of a conventional growth system such as that shown at 10 in FIG. 1. The growth system 9 includes a reaction vessel 10 in which the substrate 11 may be disposed on a susceptor 12. The susceptor 12, which is rotatable through a shaft 13, is heated by means of an radio frequency coil 14, while the walls of the reaction vessel 10 are simultaneously cooled through a water jacket 15. As shown, the upper portion of the reaction vessel provides for the inlet of gases at port 16 from a manifold which, in turn, provides for introduction of gas at inlet 17 and includes gas generators 18 and 19. Typically, an inert gas is introduced at port 17 to thoroughly flush the system. FIG. 1 indicates that the system is constructed so that the inert gas may be used as a carrier gas for the vapor phase of a group III containing organometallic at generator 18 or of the vapor phase of the conductivity modifier in generator 19. Additional gas inlets 20 provides for the introduction for such gases as arsine, phosphine, and hydrogen selenide. It should be noted that this apparatus is merely typical and that additional generators or gas inlets may be added; for example, generator 19 may readily be converted for transporting the vapor phase of a group V containing organometallic, such as trimethyl arsine or trimethyl phosphine, to the reaction vessel.

Figure 2:
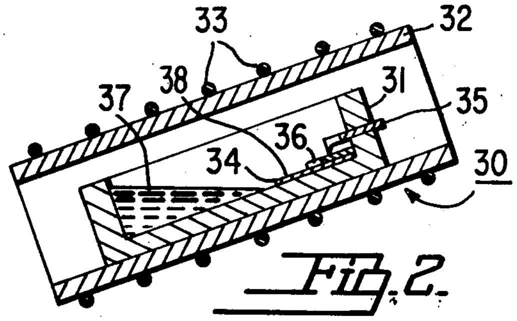
FIG. 2 is a partial cross-sectional view of an apparatus for deposition of III-V compounds by liquid phase epitaxy.

The second step of the two-stage process, that of liquid phase epitaxy, may be achieved through the use of a conventional liquid phase epitaxy apparatus 30 such as that shown in FIG. 2. Typically, the liquid phase operations are carried out in a graphite boat 31, held within a furnace tube 32. The furnace tube 32 is heated electrically by a resistance coil 33, in a manner well known in the art. An epitaxial wafer 34 composed of substrate 11, FIG. 1 and the layer of III-V compound deposited previously from an organometallic compound, is held firmly against the floor of the boat 31, FIG. 2, by a holding member 35 and a relatively resilient shim 36, both of which may also be of carbon. The previously described heat partially dissolves the existing III-V compound resulting in the III-V growth continuation with material from mixture 37 so as to form a high quality layer of III-V compound on wafer 34. To this end, typically the molten mixture 37 consists of approximately 96 to 97 per cent by weight of group III elements, 3 per cent by weight of a III-V compound containing the same group III element(s), and about 0.01 to 1.0 per cent by weight of a conductivity modifier. The conductivity modifiers which can be used include zinc, cadmium, beryllium, magnesium, tellurium, selenium, sulfur, silicon, oxygen, and nitrogen. When the molten solution 37 reaches a desired predetermined temperature, called the tipping temperature, as hereinafter specified, the furnace tube 32 is tilted (clockwise looking at FIG. 2) so that the molten solution 37 covers the major surface 38 of the epitaxial wafer 34. Heat is then removed from the furnace tube 32 by de-energizing the coil 33 and the molten solution 37 is allowed to cool to a second predetermined temperature specified below. At this temperature the furnace tube 32 is tilted again to its original position as shown in FIG. 2.

It has been found that while a variety of temperatures may be used for the growth of the first portion of the III-V compound from short chain alkyl organometallics, such as trimethyl gallium, there is an optimum temperature for growth of this material on (111) spinel of approximately 710° C. Specifically, when using trimethyl gallium and arsine by the vapor phase technique described in detail below, GaAs deposited at lower growth temperatures have exhibited poor crystallinity; and those at higher than optimum temperatures, inhomogeneity. Optimum temperatures for trimethyl gallium and trimethyl arsine is also about 710° C; the optimum temperature for the trimethyl gallium and phosphine is about 800° C; and, the optimum temperature for the trimethyl gallium and trimethyl phosphine is also about 800°C.

Other conditions required for the chemical vapor deposition (CVD) include the necessary flow conditions. While in the description of this invention a particular apparatus is employed, variations in such apparatuses would yield configurations that would also support CVD of III-V compound from organometallics. The flow conditions cited herein are specific to the particular apparatus illustrated, and, with differing apparatus geometries, the flow conditions would necessarily require suitable adjustments. For the geometry described herein, the best results are provided with flow conditions approximating the following:

| | |
|---|---|
| $H_2$ carrier gas flow | 3.0 cc/min. |
| $AsH_3$ (10% in $H_2$) flow | 400 cc/min. |
| $H_2$ carrier gas for $(CH_3)_3Ga$ | 40 cc/min. |

Under these conditions the rate of deposition is about 0.8 μm/min in a form uniformly distributed across the substrate. Higher flow rates than these favor heavy deposition at the center of the substrate, while slow rates favor deposition at its periphery. The appropriate flow rates are determined by infra red techniques, and after determining the optimum values, uniformity in deposition will be obtained.

It has been found that the growth rate depends on the film thickness. The rate increases with increasing thickness up to about 10μm. Beyond that the growth rate remains essentially constant.

In the practice of the present invention, the deposition of III-V compounds from organometallics results in a first portion which contains remanent carbon atoms. Carbon atoms are also introduced by the susceptor materials. The approximate concentration of carbon in the first portion of the first layer — III-V compound deposited from an organometallic source — is from about $1 \times 10^{15}$ to approximately $1 \times 10^{19}$ atoms/cc. These carbon atoms act as a dopant to the first portion, and this doping effect may be controlled by the selection of appropriate susceptor materials, such as graphite or silicon carbide-coated graphite. When a graphite susceptor is used in vapor phase epitaxy, the first portion is formed having P type conductivity. When such a susceptor is employed conductivity modifiers well known in the art are generally added to the liquid phase portion so as to produce an entirely homogeneous P type layer. For a III-V compound layer of opposite conductivity type a silicon carbide-coated graphite susceptor is used and N type dopants are used in the liquid phase epitaxial portion. The resultant N type and P type surfaces are ideally suited for subsequent LPE-grown layers of appropriate conductivity type so as to form junctions. The junctions formed therebetween are sharp and flat as required for high quality devices. To these layers of III-V compounds upon the insulating substrate, an electrode structure is added by any one of several well-known prior art procedures. In the practice of this invention, other dopants may be added to control qualities such as light emission.

Figure 3:
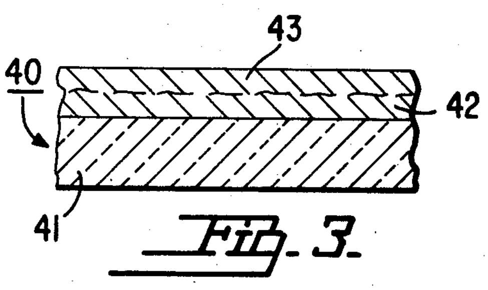
FIG. 3 is a partial cross-sectional view of an insulating substrate wafer with a III-V layer deposited thereon by the present novel process.
Figure 4:
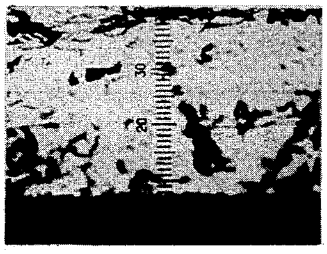
FIG. 4 is a photomicrograph of an insulating substrate wafer with a III-V layer deposited thereon by the present novel process.

Referring now to FIG. 3, an enlarged cross-sectional view of a magnesium aluminate spinel wafer is shown having a GaAs layer formed by the method of the present invention. The epitaxial wafer 40 is constructed on a (111) spinel wafer 41 with a first portion of the GaAs layer deposited upon the surface thereof formed from chemical vapor deposition at approximately 710°C from trimethyl gallium and arsine. The first portion 42 is indistinguishably joined with the uppermost region, or second portion 43, of GaAs which is grown in continuity with the first portion by liquid phase epitaxy. The epitaxy of the second portion 43 is performed in the conventional apparatus described above at a temperature of approximately 700°C. While the exact mechanism of the crystal growth phenomenon under these conditions is not completely understood, it is believed that there are few low-angle grain boundaries. Consequently, this concept of the crystal growth phenomenon is supported by the photomicrograph, FIG. 4, wherein the lower portion is the (111) spinel 41 and the adjacent indistinctly separated portions thereupon correspond with first portion 42 and second portion 43 of FIG. 3.

EXAMPLE 1

In the first example of the preferred embodiments, a vapor of trimethyl gallium is transported to the radio frequency heated substrate 11, FIG. 1, by bubbling hydrogen as a carrier gas, introduced at port 17, through the trimethyl gallium maintained at approximately 0°C, along with arsine introduced through one of the gas inlets 20. When the substrate is (111) magnesium aluminate spinel, the susceptor is preferably maintained at the optimum temperature of about 710°C. The trimethyl gallium and arsine vapors are decomposed and the Ga and As constituents thereof react to form a GaAs film on the substrate 11.

The reaction is continued until a layer approximately 10 μm thick is formed. After cooling, the substrate is removed from the reaction vessel 10 and is positioned and secured in the graphite boat 31, FIG. 2. The epitaxial wafer is typically affixed in place using a holding member 35 and shim 36. A saturated molten mixture 37 previously placed in the graphite boat 31 may consist of 97 percent by weight of gallium, 2.99 percent by weight of gallium arsenide, and 0.01 percent by weight of tellurium. The graphite boat 31 and its contents are then heated to the desired LPE tipping temperature of about 700°C. Crystal growth continuation is realized by tipping the furnace tube 32 so that the molten mixture 37 flows over the exposed major surface 38 of the epitaxial wafer 34.

EXAMPLE 2

In the second example of the preferred embodiments, the III-V compound layer is formed similar to that described in example 1, except that in the second portion the saturated molten mixture 37 previously placed in the graphite boat 31 consists of 88 percent by weight of gallium, 8.99 percent by weight of gallium phosphide, 3 percent by weight of gallium arsenide, and 0.01 percent by weight of tellurium. Using this mixture 37, a layer of gallium arsenide phosphide is grown in continuity with the previously deposited first layer of gallium arsenide.

EXAMPLE 3

In the third example of the preferred embodiments the III-V compound layer is formed similar to that described in example 2, except that the molten mixture 37 now consists of 79.2 percent by weight of gallium, 20 percent by weight of gallium arsenide, 0.79 percent by weight of aluminum, and 0.01 percent by weight of tellurium. Using this mixture 37, a layer of gallium aluminum arsenide is grown in continuity with the previously deposited gallium arsenide.

EXAMPLE 4

In the fourth example of the preferred embodiments the III-V compound layer is formed similar to that described in example 1, except that in the first portion phosphine is substituted for arsine and in the second portion the molten mixture 37 consists of a 10 percent by weight of gallium phosphide in gallium with 0.3 percent by weight of zinc oxide for a P type layer or 0.01 percent by weight of tellurium for an N type layer. Using this mixture 37, a layer of gallium phosphide is grown in continuity with the previously deposited layer of gallium phosphide.

EXAMPLE 5

In the fifth example of the preferred embodiments the III-V compound layer is formed similar to that described in example 2, except that the first portion of the layer is of gallium phosphide and is prepared as described in example 4.

The III-V compound layer on insulating substrate of the present invention is useful in the formation of improved microwave integrated circuitry, fast computer circuits, and novel light devices. By appropriate masking of the insulating substrate, and by using the present invention and conventional silicon-on-insulating substrate techniques, monolithic devices can be constructed containing, for example, III-V light emitting diodes alongside silicon-on-insulating substrate transistors. This makes possible a variety of devices such as photon-coupled pairs, photon-amplifiers and logic circuits.

Figure 5:
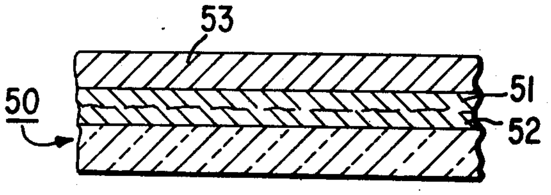
FIG. 5 is a partial cross-sectional view of an insulating substrate with two layers of III-V compound of opposite conductivity types thereon, wherein the first layer is of one conductivity type. The second layer is deposited by liquid phase epitaxy and is of opposite conductivity type.

Referring now to FIG. 5, a diode 50 made by the improved method is shown. In this device, there is a monocrystalline insulating substrate such as (111) spinel; a first layer, consisting of the second portion 51 and the first portion 52 formed by the two-stage process of the present invention; a second layer 53, grown by liquid phase epitaxy; and, sufficient electrode structure (not shown) to complete the device. In this device a junction is formed between the first and second layers. The second portion 51 of the first layer grown by liquid phase epitaxy serves a double purpose. It couples the junction to the vapor-phase-grown first portion 52 structurally and it provides doping on one side of the junction. In this particular application the second portion 51 is of opposite conductivity type to that of the second layer 53, forming therebetween a PN junction. For conventional light emitting diodes the second portion 51 may be deposited with zinc in the $10^{17}$ to $10^{18}$ atoms/cc range and the second layer 53 is doped with tellurium in the $10^{17}$ to $10^{18}$ atoms/cc range, or vice versa. It has been found optimal in the structure of these devices to use tipping temperatures in the 700° to 800°C range that are slightly higher than the optimal temperatures for the first layer 51. Cooling rates in excess of 20°C per/min for the first LPE grown layer 51 are used, while more moderate cooling rates of 10° to 20°C per/min are used for the second LPE grown layer.

Figure 6:
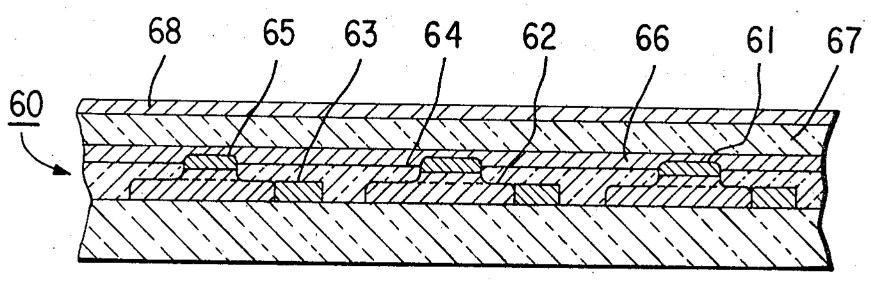
FIG. 6 is a cross-sectional view of an insulating substrate having several light-emitting diodes thereon.

After deposition of the two LPE grown layers, devices 60, FIG. 6, may be formed by etching mesas 61 in the III-V compounds so that the insulating substrate is exposed therebetween. In these mesas 61 the two layers are designated 62 and 65, respectively. Where the first layer 62 is of a P type conductivity, the common P contacts 63 may be formed by any of the methods well known in the art such as evaporation of gold doped with zinc. This structure may then be buried under a passivating layer 64 of, for example, $SiO_2$. The passivating layer 64 is etched so as to expose the second layer 65 (which is in this case of N type conductivity). Metallization using gold-tin alloys is then applied to form the N contact 66 and a final passivating layer 67 is applied. Other metallization schemes may be used such as by etching to a point just below the surface of the first layer 62 and metallizing the edge thereof. This forms a common ground contact to two or more devices. Also, the metallization can be so designed as to conform to a beam lead configuration with one of the beam leads connected to a row of mesas. Optionally, a reflecting layer 68 may then be applied over the last passivating layer 67 in order to return any back emission from the diode which may occur. In the foregoing example, it can be readily seen that with the metallization on one side of the device structure the light emitting therefrom can be brought through the light transmissive substrate and utilized directly for display purposes.

Figure 7:
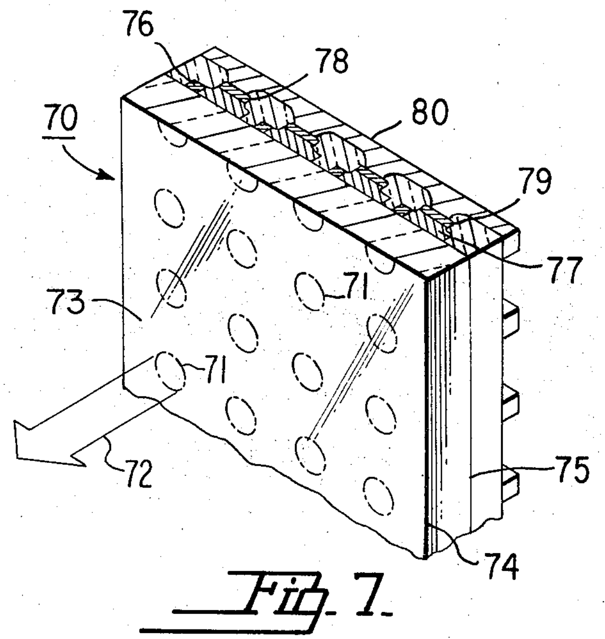
FIG. 7 is a cross-sectional view of a 4 × 4 diode matrix on a transparent insulating substrate upon which the diode structures are arrayed on one surface and the other surface is used as the face of the display.

A diode array 70 in FIG. 7 with a 4 × 4 matrix is shown. Here a light from a diode 71 is emitted in the direction of the dotted arrow 72. For purposes of identification, the insulating substrate 73 has a display surface 74 and a device surface 75. On the device surface 75, the diodes are formed as shown in FIG. 6. Common connections 76, FIG. 7, to P regions 77 are along the columns of the mesas 78. After passivation as hereinbefore described the N regions 79 are formed with a common connection 80 across the rows of diodes 71.

Other more refined techniques of diode or diode laser fabrication, such as single or double heterojunctions or close confinement structures are applicable after the first layer has been grown as described above. As described for incoherent emitters, the junctions are isolated into mesas using photolithographic techniques in conjunction with etchants or by mechanical means such as sandblasting, ultrasonic machining, or spark erosion. For laser diodes, the optical cavity can be made by cleaving.

It should be understood that while the foregoing discussion makes specific references to the fabrication of III-V composites and light emitting devices, the principles of the present invention are also applicable to the fabrication of other electronic articles.

We claim:

1. In combination,
   a monocrystalline insulating substrate; and
   a monocrystalline layer thereon, said layer comprising a first portion being an organometallic-vapor-deposited III-V compound and a second portion being a liquid-phase-derived III-V compound in continuity with said first portion.

2. The combination according to claim 1, wherein said first portion is a binary III-V compound and said second portion is selected from the group consisting of said binary III-V compound and those ternary III-V compounds including at least the same elements as said binary III-V compound.

3. A combination according to claim 1, wherein the first portion is GaAs and the second portion is GaAs, or the first film is GaAs and the second film is $GaAs_xP_{1-x}$, or the first film is GaAs and the second film of $Ga_xAl_{1-x}As$, the first film is GaP and the second film of GaP, or the first film is GaP and the second film is $GaAs_xP_{1-x}$, in all of which x is a value less than unity.

4. The combination according to claim 1, wherein said substrate permits the passage of light of wavelengths in the range of from 0.15 μm to 10 μm.

5. A combination according to claim 1, wherein said substrate is a metallic oxide ceramic.

6. A combination according to claim 5, wherein said ceramic is selected from the group consisting of beryllia, magnesium aluminate spinel, magnesium hydroxyl aluminate spinel, sapphire and thoria.

7. The combination according to claim 1, wherein said first portion is a carbon-doped III-V compound and said second portion is a III-V compound containing a conductivity modifier.

8. The combination according to claim 7, wherein the approximate concentration of carbon in said first portion is from about 1 × $10^{15}$ to approximately 1 × $10^{19}$/cc.

9. A combination according to claim 7, wherein said base layer is uniformly doped and the said first film and said second film form a homogeneous region of one conductivity type.

10. In combination, a monocrystalline insulating substrate; and a monocrystalline layer thereon, said layer comprising a first portion being a carbon-doped vapor-deposited III-V compound epitaxially related to said substrate and a second portion being a liquid-phase-derived III-V compound, containing a conductivity modifier, grown in continuity with said carbon-doped compound.

11. The combination according to claim 10, wherein the approximate concentration of carbon in said first portion is from about 1 × $10^{15}$ to approximately 1 × $10^{19}$ atoms/cc.

12. A method of forming an insulator-semiconductor composite comprising:

a. providing an insulating substrate wafer;

b. growing on said wafer by vapor phase epitaxy a first III-V epitaxial portion;

c. continuing growth of said first epitaxial portion by liquid phase epitaxy of a second III-V epitaxial portion.

13. A method according to claim 12, wherein said insulating substrate is selected from the group consisting of (111) magnesium aluminate spinel, (110) magnesium aluminate spinel and (0001) sapphire.

14. A method according to claim 12, wherein said vapor phase epitaxy is from a source comprising a gallium-containing short-chain alkyl organometallic compound.

15. A method according to claim 14, wherein said organometallic compound is trimethyl gallium reacted with a compound selected from the group comprising $As(CH_3)_3$, $AsH_3$, $P(CH_3)_3$ and $PH_3$.

16. A method of forming an insulator-semiconductor composite comprising:

a. providing a magnesium aluminate spinel wafer;

b. growing on said wafer by vapor phase deposition from an organometallic source a first III-V epitaxial portion;

c. partially redissolving the surface region of said first epitaxial portion; and d. continuing growth of said first epitaxial portion by liquid phase epitaxy from a melt containing a III-V compound dissolved in the same III element and a conductivity modifier.

17. A method according to claim 16, wherein said organometallic vapor phase deposition is formed by the reaction between trimethyl gallium and arsine at a temperature of about 710°C.

18. A method according to claim 16, wherein said conductivity modifier is selected from zinc, cadmium, beryllium, magnesium, tellurium, selenium, sulfur, silicon, oxygen, and nitrogen.

19. A method of forming a semiconductor device comprising:

a. providing an insulating substrate wafer;

b. growing on said wafer by vapor phase epitaxy from an organometallic source a first portion of a first monocrystalline epitaxial layer, said first portion being a III-V compound of one conductivity type; and c. continuing growth of said first portion by liquid phase epitaxy to form a second portion of a III-V compound of the same conductivity type; and d. growing on said first epitaxial layer a second monocrystalline epitaxial layer by liquid phase epitaxy of opposite conductivity type of said first layer.

20. A semiconductor device comprising;

a monocrystalline insulating substrate;

a first monocrystalline layer thereon of one conductivity type, said layer comprising a first portion of an organometallic-vapor-deposited III-V compound and a second portion of a liquid-phase-derived III-V compound in continuity with said first portion; and a second monocrystalline layer of opposite conductivity type on said first layer.

* * * * *